United States Patent
Morinaga

[19]

[11] Patent Number: 6,162,740
[45] Date of Patent: Dec. 19, 2000

[54] SEMICONDUCTOR DEVICE AND METHOD OF FORMING SEMICONDUCTOR DEVICE

[75] Inventor: Shirou Morinaga, Tokyo, Japan

[73] Assignee: NEC Corporation, Tokyo, Japan

[21] Appl. No.: 09/114,173

[22] Filed: Jul. 13, 1998

[30] Foreign Application Priority Data

Jul. 18, 1997 [JP] Japan ................................... 9-194381

[51] Int. Cl.⁷ ............................................. H01L 21/4763
[52] U.S. Cl. ........................ 438/758; 257/759; 257/762; 257/763; 257/765; 257/506; 257/508; 257/522; 438/622
[58] Field of Search ..................................... 257/758, 759, 257/760, 762, 763, 765, 506, 508, 522; 438/622, 623, 624, 790, 762, 765, 903

[56] References Cited

U.S. PATENT DOCUMENTS

| 5,523,615 | 6/1996 | Cho et al. ........................... 257/758 |
| 5,548,159 | 8/1996 | Jeng .................................... 257/758 |
| 5,789,818 | 8/1998 | Havemann .......................... 257/750 |
| 5,789,819 | 8/1998 | Gnade et al. ....................... 257/759 |
| 5,847,464 | 12/1998 | Singh et al. ........................ 257/752 |
| 5,936,295 | 8/1999 | Havemann et al. ................ 257/760 |
| 5,945,203 | 8/1999 | Soane .................................. 428/209 |
| 5,955,786 | 9/1999 | Avanzino et al. .................. 257/758 |
| 5,994,776 | 11/1999 | Fang et al. ......................... 257/758 |

FOREIGN PATENT DOCUMENTS 5-283542  10/1993  Japan .

*Primary Examiner*—Jey Tsai
*Assistant Examiner*—Lynne A. Gurley
*Attorney, Agent, or Firm*—Sughrue, Mion, Zinn, Macpeak & Seas, PLLC

[57] ABSTRACT

A semiconductor device according to the present invention includes insulating branches which are formed as an interlayer insulating film on a semiconductor substrate. The interlayer insulating film has holes (voids) between the branches to thereby reduce electrostatic capacitance between stacked layers within a semiconductor device.

29 Claims, 6 Drawing Sheets

SEMICONDUCTOR DEVICE AND METHOD OF FORMING SEMICONDUCTOR DEVICE

BACKGROUND OF THE INVENTION

1. Field of the Invention

The present invention relates to a semiconductor device for a semiconductor integrated circuit and its manufacturing method.

2. The Related Art

FIG. 4 shows the wiring portion of a semiconductor device having a multi-layer wiring structure using a conventional interlayer insulating film. In FIG. 4, a lower wiring layer 401 is formed on a semiconductor substrate 400 into a desired shape by evaporation and patterning. An interlayer insulating film 402 is then deposited by, for example, CVD method and the surface of the interlayer insulating film 402 is subjected to planarization by etching or the CMP method. Thereafter, an upper wiring layer 403 is formed on the interlayer insulating film 402 into a desired shape by evaporation and patterning.

According to a method shown by Japanese Patent Laid-Open Application No. 5-283542, referring to FIG. 5, a lower wiring layer 501 is formed on a semiconductor substrate 500. A cap insulating film 504 is then formed on the semiconductor substrate 500 and the lower wiring layer 501. An interlayer insulating film 502 including glass coating material mixed with Al grains of sub-micron diameter is applied onto the cap insulating film 504. The interlayer insulating film 502 is heated to about 400° C. and formed into glass. Thereafter, only Al attaching to the glass coating material is selectively etched to thereby form holes 505 within the interlayer insulating film 502. A second cap insulating film 506 is then formed on the interlayer insulating film 502 to form an upper wiring layer 503.

The related art shown in FIG. 4, however, is disadvantageous in that high-speed operation is difficult to realize because the circuit operation speed is controlled by wiring capacity. The reason is that the interlayer insulating film 402 has a material-peculiar dielectric constant and its capacitance is higher than that of air with the result that high-speed operation is prevented.

The related art shown in FIG. 5 is also disadvantageous in that it is difficult to form holes 505 within the interlayer insulating film 502. The reason is that it is difficult to remove Al grains selectively. In order to remove Al grains well, it is necessary for Al grains to mix into the coating material without being separated from each other by the coating material. If grains are separated from each other by the coating material selective etching cannot be achieved because the coating material prevents Al grains for being etched.

SUMMARY OF THE INVENTION

It is an object of the present invention to provide a semiconductor device and its manufacturing method that reduces the electrostatic capacity of the interlayer insulating film.

A semiconductor device of the present invention comprises a lower wiring layer formed over a semiconductor substrate, a first insulating film at least covering the lower wiring layer, a plurality of insulating branches or strings formed on the first insulating film to secure space between the insulating branches, and a second insulating film formed on upper ends of said insulating branches.

A method of forming a semiconductor device, comprises the steps of, forming nuclei on a first insulating film formed over a semiconductor substrate, forming insulating branches or strings from the growth nuclei, and forming a second insulating film on upper ends of the insulating branches.

BRIEF DESCRIPTION OF THE DRAWINGS

The above and other objects, advantages and feature of the present invention will be apparent from the following description taken in conjunction with the accompanying drawing, in which.

DETAILED DESCRIPTION OF THE PREFERRED EMBODIMENTS

Figure 1:
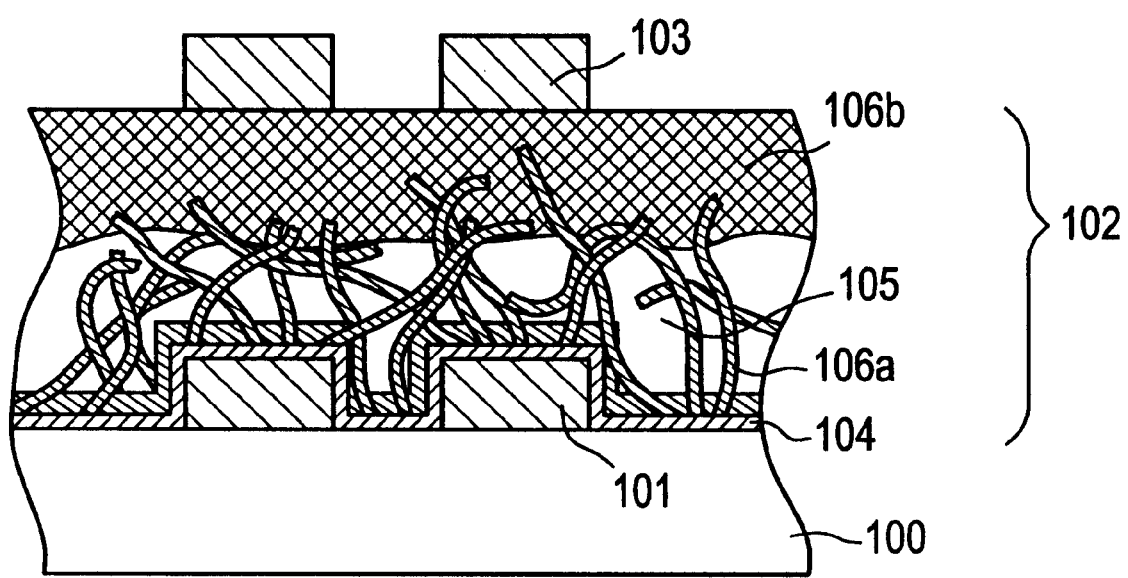
FIG. 1 is a cross-sectional view showing a semiconductor device of a first embodiment according to the present invention.

FIGS. 1 and 2 shows the first embodiment of the present invention. In FIG. 1, a semiconductor device of the first embodiment according to the present invention has a structure in which an interlayer insulating film 102 is provided between an upper wiring layer 103 and a lower wiring layer 101 on a semiconductor substrate 100. The interlayer insulating film 102 comprises insulating branches 106a and an insulating film 106b. The insulating branches 106a are expanded, like strings, from the lower wiring layer 101 in the upward direction mainly to secure holes or space 105 between the wiring layers 101 and 103. The insulating film 106b is formed on the upper ends of the insulating branches 106a as a layer and supports the upper wiring layer 103. The insulating branches 106a are expanded in a branch manner based on growth nuclei formed on a thin insulating film 104 covering the lower wiring layer 101, to secure the holes 105. The insulating branches 106a has a diameter of about 1 micron and a length of several microns to several tenth microns.

According to the first embodiment of the present invention shown in FIG. 1, the holes 105 are secured between the upper wiring layer 103 and the lower wiring layer 101 by the insulating branches 106a. Due to the presence of the holes 105, electrostatic capacitance between the upper wiring layer 103 and the lower wiring layer 101 is reduced, thereby making it possible to reduce the influence of the electrostatic capacitance to a minimum.

Figure 2A:
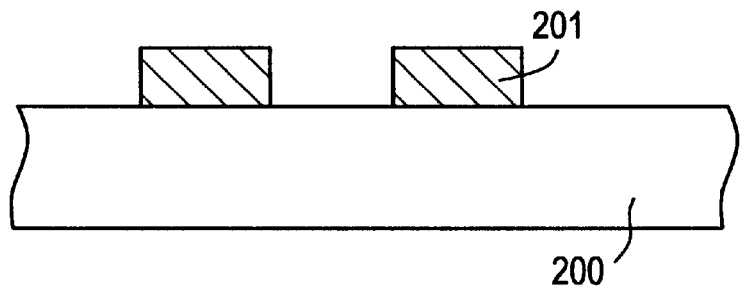
FIGS. 2A through 2H are cross-sectional views showing the respective steps of forming the semiconductor device of the first embodiment according to the present invention.
Figure 2B:
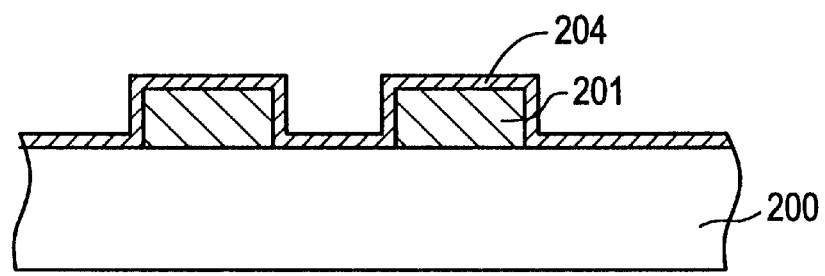

A method for manufacturing a semiconductor device in the first embodiment will be described using FIGS. 2A to 2H. As shown in FIG. 2A, a lower wiring layer 201, for example, formed by polysilicon, aluminum, or copper, is formed on a semiconductor substrate into a pattern of desired shape. Next, as shown in FIG. 2B, a first cap insulating film 204 is formed on the lower wiring layer 201 under conditions independent of the presence or absence of a metal wiring layer, by, for example, the CVD method to a thickness of about 1000 Å. Specifically, the first cap insulating film 204 is formed out of a silicon oxide film by means of, for example, the plasma CVD method or atmospheric pressure CVD method using $SiH_4$ gas.

Figure 2C:
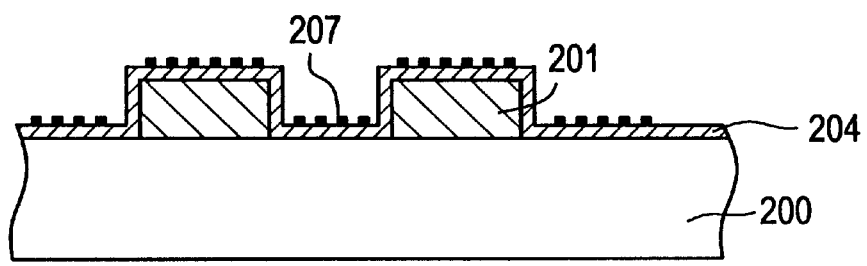

Next, as shown in FIG. 2C, grains or particles of metal such as Fe, Zinc (Zn), Titanium (Ti) and platinum (Pt) which become growth nuclei 207 are dispersed or sprayed on the first cap insulating film 204. The degree of growth for a particular growth nuclei 207 is dependent upon interlayer insulating film material. The growth nuclei 207 is not limited to Fe, Zn, Ti and Pt, but may be material which is able to make insulating branches form, for example, which accelerates insulating branches growth by functioning as a catalyst. Each of the growth nuclei has preferably a size (diameter) of not more than 1 micron to form the insulating film having a string shape (fiberous in total). The growth nuclei is dispersed arranged with a micro-pattern of grain or a pattern like a land consisting of a plurality of grains. In addition, for attaching the metal, as a catalyst, on the insulating film, such methods as coating liquid into which grains of metal such as Fe, Zn Pt are distributed, spraying the liquid, spraying solutions into which metal is dissolved, to the insulating film, and the like can be adopted. It is also possible to employ a residue method and the like by which a resist film having a submicron-size opening pattern is formed, a metal film is formed on the entire surface by using the evaporation method and the like and the resist is desolved and removed by, for example, sulfated water to thereby remove an unnecessary metal film on the resist and to form the metal into a desired pattern.

Figure 2D:
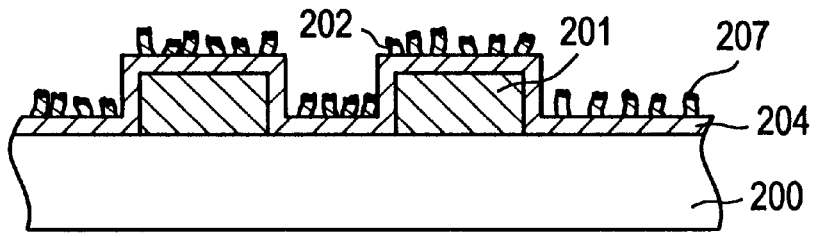
Figure 2E:
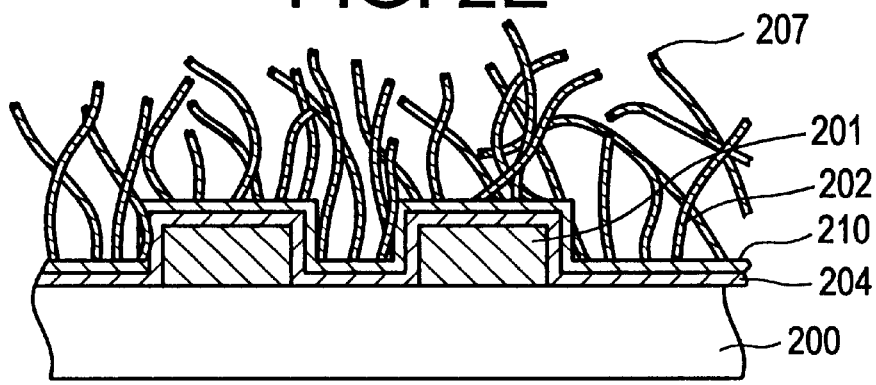

Next, as shown in FIGS. 2D and 2E, the insulating film is expanded and grown into strings or branches stemming from the place where the growth nuclei 207 is located, on the first cap insulating film 204 to form the insulating branches 202. Here, the growth rate of the insulating film to which the growth nuclei 207 serving as a catalyst attach was about 100 times as fast as that of the portions where the growth nuclei 207 are not attached. It is concluded that this is because the metal as the growth nuclei functions as a catalyst. In order to form a string-shape insulating film, the low pressure CVD method is employed at a temperature of about 700 to 850° C. and at a pressure of 1 to 2 Torr, for example, 1 Torr while HTO (High Temperature Oxide) is used as a material and silane, for example, $SiH_4$ and $N_2O$ gas are used as material gas. Under these condition, plasma is produced in a chamber. The temperature of about 700 to 850° C. is higher than the temperature of about 400° C. which is used for a conventional low pressure CVD method. As a result, the insulating film is grown on the place where a fine metal pattern consisting of growth nuclei 207 is formed on the first cap insulating film 204 at a rate about 100 times faster than the place where the growth nuclei 207 do not exist on the first cap insulating film. The insulating branches 202 are thereby formed into a string shape and in sum total appear on the device much like grass on a lawn (i.e., fibberous in appearance). That is, the insulating branches 202 formed as an interlayer insulating film, are formed at a condition where its growth rate depends on the layer 204 including the growth nuclei 207. Further, when the insulating branches are grown, an insulating film 210 is grown on the entire surface of the first cap insulating film 204. The insulating film 210 is thinner than the length of the insulating branches 202.

Figure 2F:
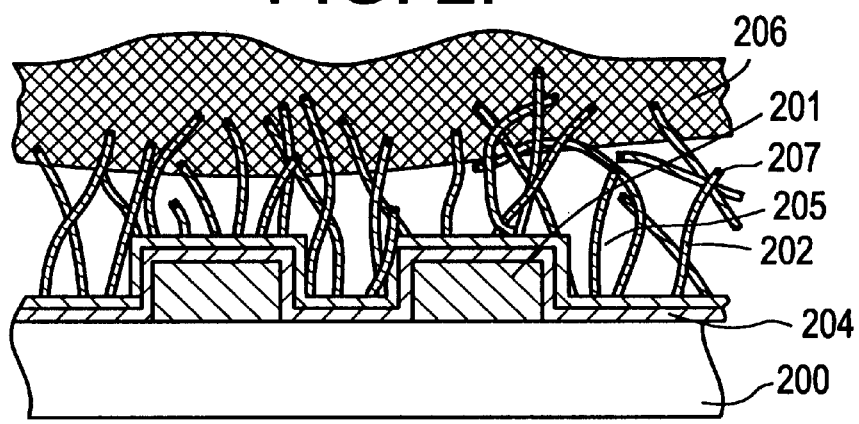

Next, as shown in FIG. 2F, a layer-shaped insulating film 206 is formed on the upper ends of the insulating branches 202 by the CVD method or the like, for example, using a CVD method at a temperature of about 400° C. Since the insulating film 206 is grown isotropically under conditions independent of any substrate, as in the case of the first cap insulating film, it is formed into a layer.

Figure 2G:
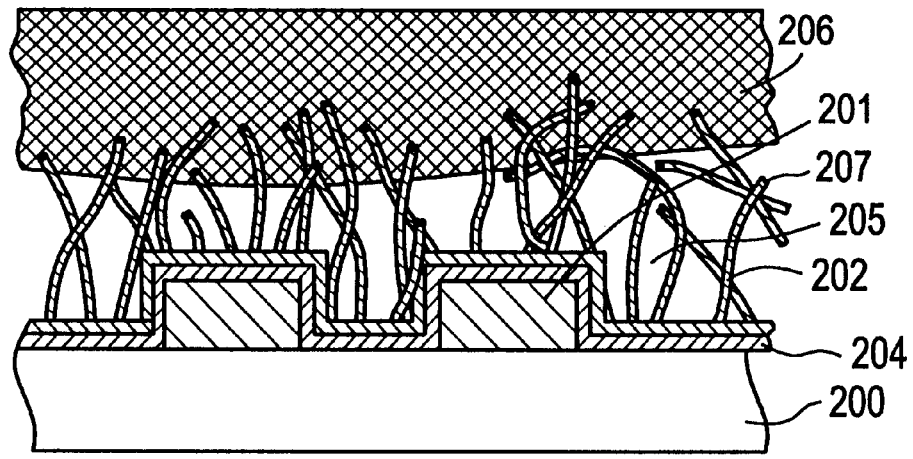
Figure 2H:
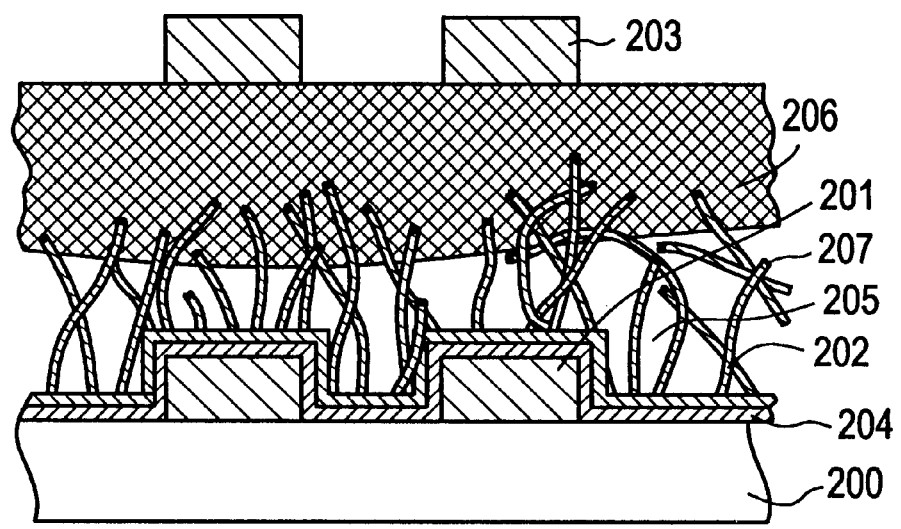

As shown in FIG. 2G, the surface of the insulating film 206 is flattened, for example, by using CMP (chemical mechanical polishing) method, and an upper wiring layer 203 is formed on the upper surface of the flattened insulating film 206 into a desired pattern as shown in FIG. 2H. The growth nuclei 207 are located at top ends of the insulating branches as shown in FIG. 2H.

Figure 3A:
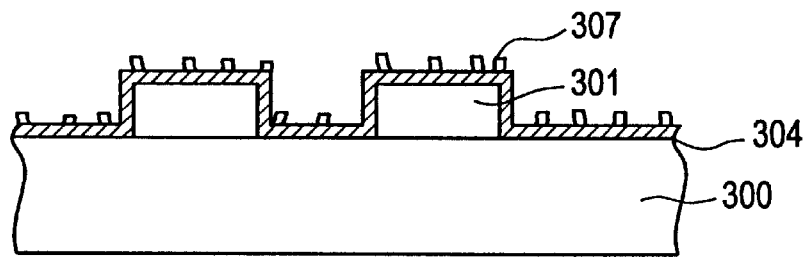
FIGS. 3A to 3C are cross-sectional views showing the respective steps of forming the semiconductor device of the second embodiment according to the present invention.
Figure 3B:
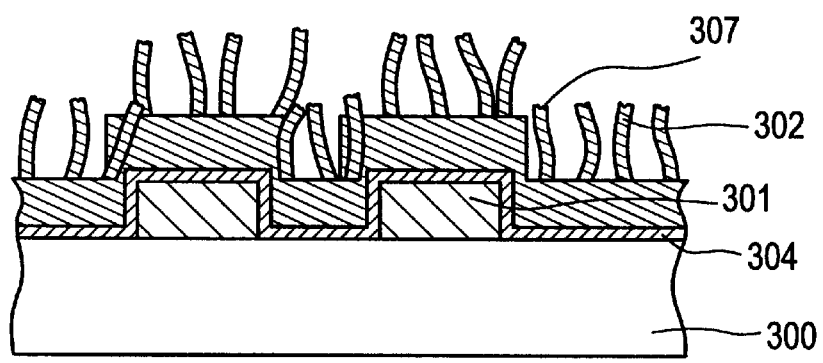
Figure 3C:
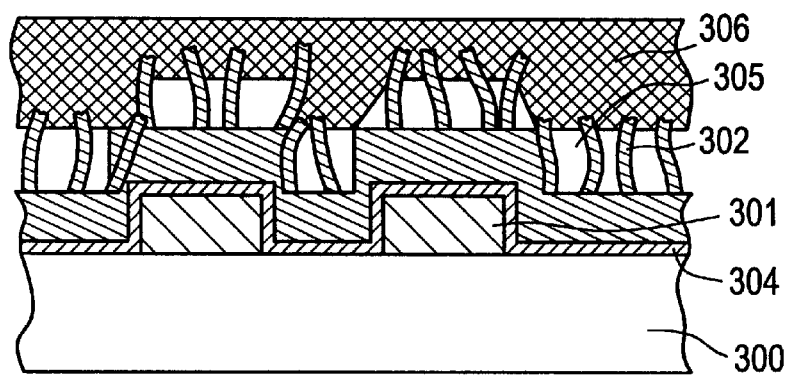
Figure 4:
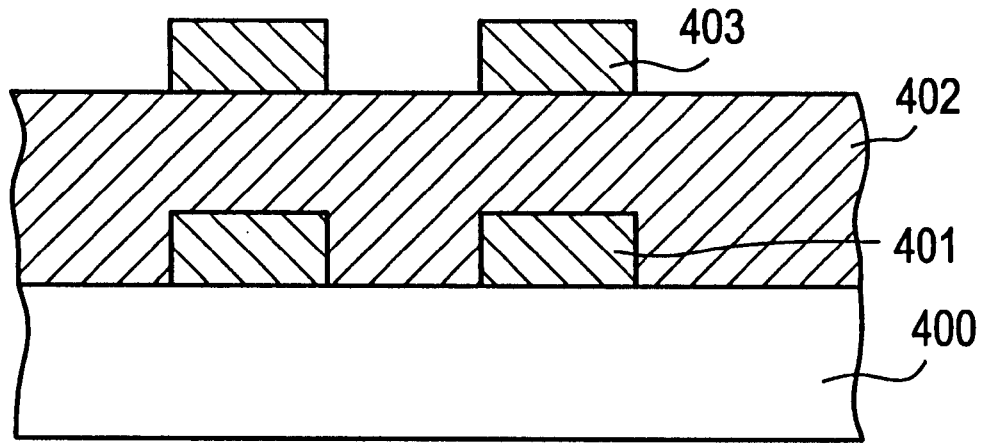
FIG. 4 is a cross-sectional view showing a first related art.
Figure 5:
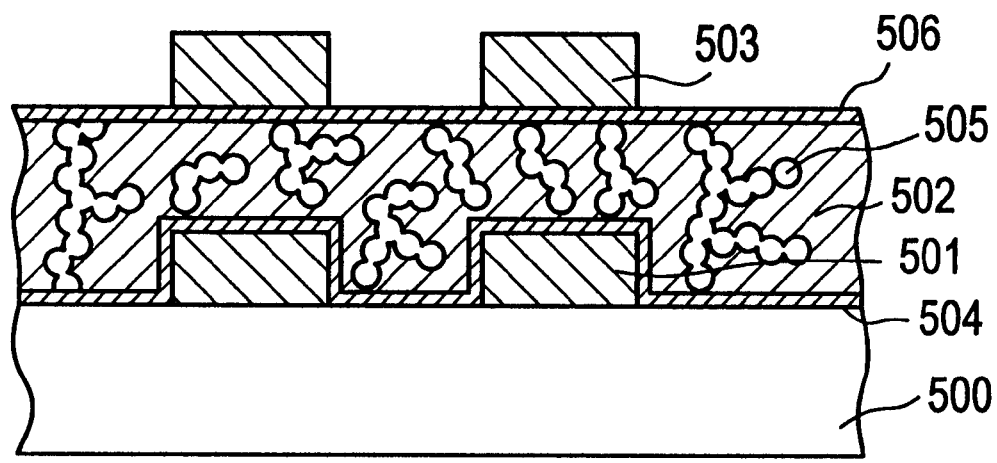
FIG. 5 is a cross-sectional view showing a second related art.

FIGS. 3A to 3C show the method of forming a semiconductor device of a second embodiment according to the present invention. First, as shown in FIG. 3A, on a first cap insulating film 304 covering the wiring layer 301 and a semiconductor substrate 300, an organic compound, for example, formed by TEOS (tetra et oxide silane:$(C_2H_5O)_4SiH_4$), is coated. The wiring layer 301 is made by, for example, polysilicon, aluminum, or copper. The first cap insulating film 304 is formed by, for example, the CVD method to a thickness of 1000 Å, preferably, formed out of a silicon oxide film by means of, for example, the plasma CVD method or a $SiH_4$ atmospheric pressure CVD method. The organic compound is thereafter patterned to selectively leave part of the organic compound 307 on the insulating film 304.

As shown in FIG. 3B, after that, the organic compound is selectively or tropically grown into a string shape using the remaining organic compound 307 as nuclei to form insulating branches 302. These organic branches 302 are grown with organic reaction gas. For example, the organic reaction gas contains oxide ozone $O_3$ and methane gas. In this situation, since the insulating branches 302 is grown from the remaining organic compound 307, the remaining organic compound 307 is at a low end of the insulating branches 307. As a result, holes 305 are secured among the grown organic compound 307.

Next, as shown in FIG. 3C, a second cap insulating film 306 is formed with organic reaction gas by the CVD method isotropically under conditions so as to have no underlying layer dependency, e.g., not following the contour of the underlying layer. Thereafter, the surface of the insulating film 306 is flattened and an upper wiring layer is formed on the flattened surface.

As described so far, according to the present invention, the holes are provided within the interlayer insulating film between the upper and lower wiring layers. It is therefore possible to reduce electrostatic capacitance thereby increasing the operation speed of the integrated circuit.

Furthermore, since the insulating branches are expanded and grown into string shape and secure holes, it is possible to make manufacturing steps easier and simpler for insulating layers including voids or pockets of air.

It is apparent from the specification that the present invention is not limited to the above embodiments but may be modified and changed without departing from the scope and spirit of the invention. For example, insulating film pillars or strings could be formed any number of methods so long as the interlayer insulating film has air pockets laced with minute strands of insulation film affirmatively formed to support a subsequent isotropically formed insulating film. Further, one skilled in the art recognizes that the above described invention is not limited to multi-layer wiring structures, but also applicable in the formation of any interlayer insulating layer of a semiconductor device where reduced capacitive coupling of various layers and components is desired.

What is claimed is:

1. A semiconductor device comprising:
   a first wiring layer formed over a semiconductor substrate;
   a first insulating film at least covering said first wiring layer;
   a plurality of insulating branches formed on said first insulating film to secure space between said insulating branches;

a second insulating film formed on upper ends of said insulating branches; and a second wiring layer formed on said second insulating film.

2. The device as claimed in claim 1, further comprising growth nuclei being on said upper ends of said insulating branches.

3. The device as claimed in claim 1, further comprising growth nuclei being on lower ends of said insulating branches.

4. A semiconductor device comprising:

lower and upper insulating films; and a plurality of insulating branches which extend from portions of said lower insulating film like strings to provide space between said lower and upper insulating films, said upper insulating film being supported by said insulating branches.

5. The device as claimed in claim 4, wherein each said insulating branches has growth nuclei formed by metal selected from Fe, Zn, Ti and Pt.

6. The device as claimed in claim 5, wherein said growth nuclei has a diameter of 1 micron or less.

7. The device as claimed in claim 6, wherein said insulating branches are grown faster at positions where said growth nuclei is present, relative to the positions where said growth nuclei is absence.

8. The device as claimed in claim 7, wherein material at said insulating branches grow at about 100 times faster than positions where said growth nuclei is absence.

9. The device as claimed in claim 7, wherein said growth nuclei are formed by a coating liquid into which said growth nuclei are distributed on said lower insulating film.

10. The device as claimed in claim 7, wherein said growth nuclei is formed by spraying liquid, into which said growth nuclei are distributed, on to said lower insulating film.

11. The device as claimed in claim 7, wherein said growth nuclei is formed by spraying liquid, into which said growth nuclei are dissolved, on said lower insulating film.

12. The device as claimed in claim 7, wherein said growth nuclei is formed by the steps of forming a resist film having openings whose size are sub-micron on said lower insulating film; forming a metal film on said resist film, and removing said resist film to produce metal left on said lower insulating film by said openings as said growth nuclei.

13. The device as claimed in claim 7, wherein said insulating branches are formed by low pressure CVD method.

14. The device as claimed in claim 13, wherein said insulating branches use a gas including silane and $N_2O$.

15. The device as claimed in claim 14, wherein said insulating branches are formed under temperature of about 700 to 850° C.

16. The device as claimed in claim 15, wherein said insulating branches are formed under pressure of about 1 Torr.

17. The device as claimed in claim 4, wherein each said insulating branches contains growth nuclei formed by organic compound.

18. The device as claimed in claim 17, wherein said growth nuclei are formed by TEOS.

19. The device as claimed in claim 18, wherein said growth nuclei are grown with organic reaction gas.

20. The device as claimed in claim 19, wherein said organic reaction gas contains oxide ozone $O_3$ and methane gas.

21. The device as claimed in claim 20, wherein when said insulating branches are grown, an insulating layer is grown on the almost entire surface of said lower insulating film, said insulating layer being thinner than the length of said insulating branches.

22. A semiconductor device comprising:

lower and upper insulating films; and a means for growing branches which provides air pockets space between said lower and upper insulating films.

23. The device as claimed in claim 22, wherein said means for growing branches have growth nuclei with a diameter of 1 micron or less.

24. The device as claimed in claim 23, wherein said growth nuclei formed by metal selected from Fe, Zn, Ti and Pt.

25. The device as claimed in claim 24, wherein said means for growing branches results in branches which are grown faster at positions where said growth nuclei is present, relative to the positions where said growth nuclei is absence.

26. The device as claimed in claim 25, wherein said means for growing branches are formed by low pressure CVD method using a gas including silane and $N_2O$ under temperature of about 700 to 850° C.

27. The device as claimed in claim 26, wherein when said branches are grown, an insulating layer is grown on the almost entire surface of said lower insulating film, said insulating layer being thinner than the length of said insulating branches.

28. The device as claimed in claim 22, wherein each said means for growing branches contains growth nuclei formed by organic compound.

29. The device as claimed in claim 28, wherein said growth nuclei are formed by TEOS containing oxide ozone $O_3$ and methane gas.

* * * * *